United States Patent [19]

Ward, III

[11] 4,139,668
[45] Feb. 13, 1979

[54] FILM-GRID COMPOSITE SUBSTRATE FOR ELECTRON MICROSCOPY

[75] Inventor: William J. Ward, III, Schenectady, N.Y.

[73] Assignee: General Electric Company, Schenectady, N.Y.

[21] Appl. No.: 852,243

[22] Filed: Nov. 17, 1977

[51] Int. Cl.² .............................................. B32B 9/04
[52] U.S. Cl. ................................... 428/138; 428/450; 428/447; 428/412; 250/311; 250/452
[58] Field of Search ............... 428/447, 412, 450, 138; 250/311, 452

[56] References Cited

U.S. PATENT DOCUMENTS

| 3,189,662 | 6/1965 | Vaughan | 260/824 |
| 3,419,634 | 12/1968 | Vaughan | 260/33.2 R |
| 3,419,635 | 12/1968 | Vaughan | 260/33.2 R |
| 3,767,737 | 10/1973 | Lundstrom | 264/41 |
| 3,874,986 | 4/1975 | Browall | 428/412 |
| 3,980,456 | 9/1976 | Browall | 156/94 |

Primary Examiner—George F. Lesmes
Assistant Examiner—E. Rollins Buffalow
Attorney, Agent, or Firm—Richard G. Jackson; Joseph T. Cohen; Leo I. MaLossi

[57] ABSTRACT

A film-grid composite substrate for supporting specimens in electron microscopy comprises a specimen-support grid adapted for electron microscopy and an ultra-thin film of a mixture of organopolysiloxane-polycarbonate interpolymer and polyphenylene oxide. Regions of a major surface of the film are in contiguous relationship with a major surface of the grid, while other major surface regions of the film span apertures defined by the grid structure.

13 Claims, 4 Drawing Figures

FILM-GRID COMPOSITE SUBSTRATE FOR ELECTRON MICROSCOPY

BACKGROUND OF THE INVENTION

The present invention relates to a film-grid composite substrate for supporting specimens in electron microscopy. The invention further relates to a strip of such substrates.

Composite substrates for supporting specimens in electron microscopy are well known in the art. Such substrates include a specimen-support grid on which is mounted a very thin specimen-support film. The low penetrating power of electrons in the voltage range typically employed in electron microscopes necessitates, as a practical matter, employment of very thin support films (e.g. 200 to 400 angstroms in thickness) exhibiting high transparency to electrons. In general, thinner films of a given material exhibit greater transparency to electrons. However, the typically lower strength of such thin films necessitates use of film-support grids having small diameter apertures, resulting in greater interference patterns from the correspondingly higher percent grid area occupied by the aperture-defining network. Plastic materials of which heretofore known support films have been formed include Formvar SM polyvinyl formal. As described in "Accessories for Microscopy," 1975 Catalog of Ernest F. Fullam, Inc. Schenectady, New York, at page 20, Formvar films are generally on the order of 200 angstroms or more in thickness and have a tendency to decompose in electron beams and to move slightly when first irradiated. Specimen-support films, specimen-support grids and assemblies thereof are described in greater detail by D. E. Bradley in Chapter Three (pages 46–62) ("The Preparation of Specimen Support Films") of *Techniques for Electron Microscopy*, published by Charles C. Thomas, Springfield, Illinois and edited by Desmond Kay (1961).

Films formed of blends or mixtures of organopolysiloxane-polycarbonate interpolymer and polyphenylene oxide are described in U.S. Pat. No. 3,980,456 (Browall), U.S. Pat. No. 3,874,986 (Browall et al.), and copending U.S. patent application Ser. No. 536,650 filed Dec. 26, 1974 (Ward), assigned to the assignee hereof. The foregoing patents and patent application are incorporated herein by reference. Hereinafter the organopolysiloxane-polycarbonate interpolymer and the polyphenylene oxide polymer are referred to, for brevity, as PSPC and PPO, respectively.

It has now been found by practice of the present invention that ultrathin films of a mixture of PSPC and PPO may be employed in film grid composite substrates for supporting specimens in electron microscopy. Such composite substrates are typically characterized with good adherence of the film to the grid, while the film exhibits improved transparency to electron beams and good stability therein. The film is further characterized with high strength and substantial freedom from contamination and imparts eminent suitability to the composite for use as a specimen-supporting substrate in electron microscopy.

As used herein, the term "transparency" means percent transmission of electrons in electron beams typically employed in electron microscopes. Such beams may have voltages in the range from, e.g. about 50 or less to about 100 or more kilovolts (KV). The term "stability" and terms of like import, as used herein with reference to a characteristic of films in an electron beam, means the extent to which the film resists decomposition and movement during irradiation by the electrons. "Ultrathin" films, as used herein, means films having thickness of not more than about 1,000 angstroms.

DESCRIPTION OF THE INVENTION

Generally stated, in one aspect, the present invention is for a film-grid composite substrate for supporting specimens in electron microscopy. The composite substrate comprises a specimen support grid adapted for electron microscopy and an ultrathin film comprising a mixture of at least one organopolysiloxane-polycarbonate (PSPC) interpolymer and at least one polyphenylene oxide (PPO). Regions of a major surface of the film are in surface-to-surface contact with a major surface of the grid, while other major surface regions of the film span apertures defined by the grid structure.

In another aspect, generally stated, the present invention provides a self-supporting strip of film-grid composite substrates. The strip comprises (a) a releasable support layer which may be of polymeric material, (b) an ultrathin film of the above mixture of PSPC and PPO, and (c) a plurality of spaced apart specimen support grids disposed between the film and layer. Major surfaces of the grids are in releasable surface-to-surface contact with opposing regions of a major surface of the support layer. The film is in adhering surface-to-surface contact with opposite major surface regions of the grids and in releasable surface-to-surface contact with regions of the support layer surrounding the grid-contacting regions thereof. Individual film-grid composite substrates may be readily removed from the strip.

BRIEF DESCRIPTION OF THE DRAWING

This invention will be better understood from the following detailed description taken with the accompanying drawing wherein like numerals refer to similar elements throughout and.

DETAILED DESCRIPTION OF THE INVENTION AND MANNER AND PROCESS OF MAKING AND USING IT

Figure 1:
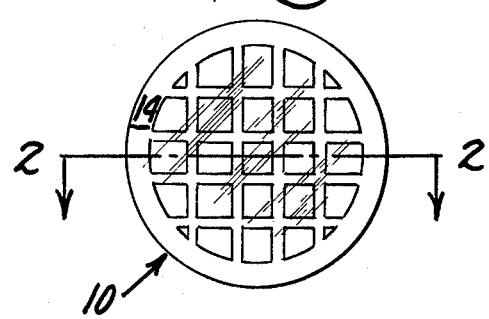
FIG. 1 is a plan view of a film-grid composite substrate in accordance with a preferred embodiment of this invention.
Figure 2:
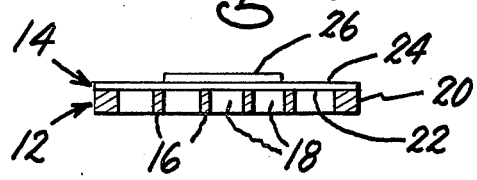
FIG. 2 is a sectional view taken on line 2—2 of FIG. 1 with a specimen for electron-microscopic examination thereon.

Referring now to the drawing and especially FIGS. 1–2 thereof, there is shown film-grid composite substrate 10 including specimen-support grid 12 adapted for electron microscopy and mounted thereon ultrathin film 14 of a mixture of PSPC and PPO. As illustrated, grid 12 may be a thin circular disc including rim 20 surrounding and integrally formed with a network of ribs or cross members 16 defining apertures 18. Regions of film major surface 22 opposite the upper surface of the cross-member and rim portions of the grid are in contiguous (and preferably adhering) surface-to-surface contact therewith, while the apertures are spanned by portions of the film surface opposite thereto. In use, specimens illustrated by specimen 26 may be placed on exposed major surface 24 of the ultrathin PSPC-PPO film and examined or photographed in an electron microscope using well known procedures therefor.

One of the problems of heretofore known film-grid composite substrates is that the relatively low strength of the plastic films heretofore employed results in such films being self-supporting only over very small areas (e.g. 0.01 mm²) and short spans. The diameter of the apertures in the grids of the present invention may be up to 0.5 mm or more, while areas of up to 0.25 or more mm² may suitably be employed. Smaller diameters and areas are not precluded.

Specimen support grids for electron microscopy and methods for their preparation are well known in the art so a detailed description thereof is not necessary herein. Grids may be obtained commercially from Ernest F. Fullam, Inc. (Schenectady, New York) and other suppliers. The grids may be of any suitable size and shape and of any suitable material. Suitable grid materials include metalliferous materials and alloys thereof, for example, copper, nickel, platinum, and stainless steel. Although the illustrated grid is generally circular, rectangular or other regular shapes as well as irregular shapes may be employed.

The film may be coextensive with the major surface of the grid or not as desired. Coextensive films and grids are generally preferred. The grids may have a matte surface in contact with the film for better adhesion therebetween. The grids may be for example, circular discs of about 2 to about 3 millimeters in diameter and about 10 microns in thickness. The grids may be of any suitable stiffness, ranging from flexible through semi-rigid to rigid. In general, semi-rigid discs are preferred.

PSPC interpolymers suitable for use in admixture with PPO polymers in the film component of the composite substrate include repeating units desirably comprising bisphenol-A carbonate (BAC) units and dimethylsiloxane (DMS) units, preferably wherein the BAC and DMS units are present in blocks. Block interpolymers of BAC and DMS and methods for the preparation thereof are described in U.S. Pat. No. 3,189,662-Vaughn, Jr., (incorporated herein by reference). The BAC-DMS interpolymers may be alternating, random block polymers of the -ABABA- type in which the blocks are polydisperse. Such interpolymers may be represented by the formula below and may include other interpolymerized monomer units (not shown):

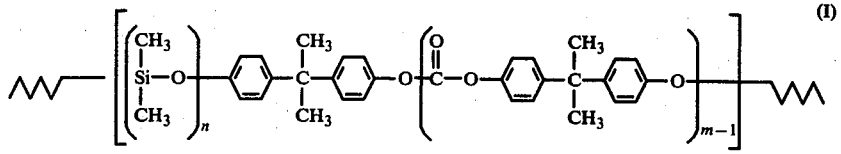

Additional teachings are provided in U.S. Pat. No. 3,419,634 (Vaughn) and U.S. Pat. No. 3,419,635 (Vaughn) on the preparation of silicone/polycarbonate copolymers.

The PSPC interpolymer $\overline{M}_w$ (weight average molecular weight) may be in the range from about 15,000 to about 150,000, n and m being numbers selected to accommodate these values for the interpolymer of formula I.

Preferably, the PSPC interpolymer is an alternating block interpolymer including from about 50 to about 60 percent by weight dimethyl siloxane (DMS) units and from about 20 to about 30 DMS units per siloxane block.

The PPO may be substituted or unsubstituted. Poly(2,6-dimethylphenylene oxide) is the preferred PPO, which preferably has an intrinsic viscosity greater than about 1.0.

PSPC and PPO polymers may be included in the mixture in any suitable amounts relative to each other. Desirably, the PPO is included in an amount from about 20 to about 80 parts by weight and the PSPC interpolymer is included in a corresponding amount of from about 80 to about 20 parts by weight per 100 parts by the total weight of these polymers. Preferably, PSPC and PPO are each present in an amount of from about 40 to about 60 parts by weight and more preferably in an amount of about 50 parts by weight on the foregoing weight basis.

Desirably, the ultrathin film is from about 100 to about 1,000, and preferably from about 200 to about 400, angstroms in thickness.

The ultrathin film may be prepared, for example, by the method described in the above Ward application by casting on a confined liquid surface. A pair of moveable longitudinally extending barriers initially spaced apart a small distance and in contact with the liquid surface are employed, first, to accommodate the casting solution therebetween and second, by relative separation thereof to controllably permit spreading of the casting solution over the surface of the film support liquid. Water is the generally preferred film support liquid.

Figure 3:
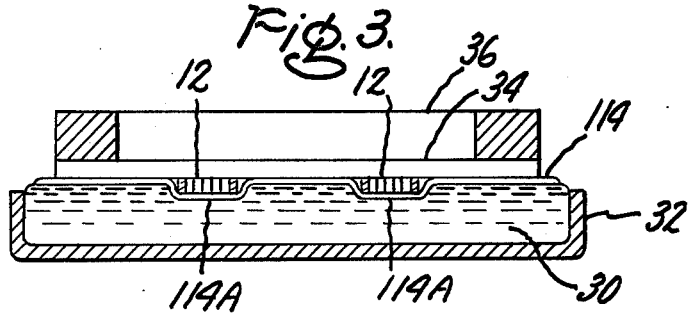
FIG. 3 is a sectional elevational view of an arrangement useful in a method for preparing one or more of the film-grid composite substrates.

FIG. 3 illustrates an arrangement useful for preparing one or more of the film-grid composite substrates. The arrangement includes film-support liquid 30 (which may be, for example, water) in container 32. Relatively large ultrathin film 114 floating on the top of the liquid is shown having cup-shaped portions 114A (two shown) which have been formed by depositing grids 12 thereon in the illustrated locations. Film 114, which is of the same composition as film 14, may have been prepared on the surface of the liquid in the above described manner. An adhesive polymeric sheet 34 of, e.g. vinylidene chloride-vinyl chloride interpolymer (PVDC-VC), commercially available as saran, is adhered to the opposing planar surface of loop 36, which may be of metal. The loop-sheet assembly is gently placed in the illustrated position to contact the sheet with the film 114 and grids. PVDC-VC sheets are found to releasably adhere to the film and grids. Alternatively, the grids may initially be deposited onto the illustrated grid-contacting surface of the PVDC-VC sheet, which releasably holds the grids thereon. The resulting assembly with the grids thereon is then lowered onto the film surface, causing the film cup-shaped portions 114A to be formed therein as illustrated.

The assembly is thereafter picked up with the grids and film adhered to the PVDC-VC sheet and the resulting pre-form of strip of film-grid composite substrates 210 (FIG. 4) is thereafter removed from the loop.

The composite substrate strip 210 includes support layer 234 of polymeric material (shown partially removed in the support-layer-facing view of FIG. 4), ultrathin film 214 of the above described PSPC-PPO mixture, and a plurality of spaced apart specimen-support grids 12 therebetween. Film 214 and sheet 234 are the same as film 114 and sheet 134 respectively, except the edges thereof have been trimmed off. Major surfaces of the grids are in releasable surface-to-surface contact with opposing regions of a major surface of the support layer 234. The film 214 is in adhering surface-to-surface contact with the opposite major surface regions of the grids and in releasable surface-to-surface contact with regions of the support layer surrounding and intermediate the grid-contacting regions thereof.

Individual film-grid composite substrates 10 may be readily removed from the strip as by (a) cutting through the thickness of the composite strip around the periphery of a selected grid to sever a generally grid-shaped section of the composite strip from the balance of the strip and thereafter (b) peeling the support layer therefrom. If desired, the two foregoing steps may be reversed in sequence.

If desired the ultrathin film may be a laminar structure of two or more film layers of the same or different composition.

Practice of the present invention is further illustrated by the following example.

EXAMPLE

An ultrathin film was prepared substantially as described in Example 3 of the above Ward application by casting on a water surface a solution of 1.4 grams PPO having an intrinsic viscosity greater than 1.0, 0.6 gram PSPC (53% by weight dimethylsiloxane; about 20 to 30 units thereof per block), and 100 cc of a 1:1 (by volume) mixture of 1,2,3-trichloropropane and trichloroethylene.

Figure 4:
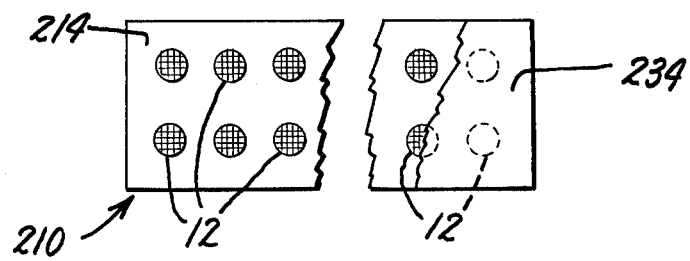
FIG. 4 is a fragmentary plan view illustrating a strip of film-grid composite substrates embodying another aspect of this invention.

Prior to casting, the casting solution was filtered through a 0.25 micron filter. A number of grids were disposed in uniformly spaced apart manner substantially as illustrated in FIG. 4 on a saran sheet about 10 microns in thickness, with the opposite side of the saran adhered by an adhesive to a metal loop substantially as illustrated in FIG. 3. The loop-supported saran having grids thereon was placed in contact with the cast film and the resulting film-grid-saran composite strip was removed from the surface of the water by lifting the loop. Thereafter a second film, similar to the first, was cast and picked up in like manner on the initially removed film-grid-saran composite strip. Individual film-grid composite substrates (substantially as illustrated in FIGS. 1-2) were severed from the strip and, after the support layer was removed, these substrates were examined in an electron microscope. The substrates were found to be eminently suitable for electron microscopy specimen supports in that the films exhibited good adherence to the grids, the films were substantially contaminant-free, exhibited excellent transparency to the electron beam, and were highly stable therein. These film-grid composite substrates were judged to be superior to conventional composite substrates employing polyvinyl formal films, especially in regard to the properties set out immediately above.

BEST MODE COMTEMPLATED

The best mode contemplated for carrying out this invention has been set forth in the description above, for example, by way of setting forth preferred film compositions, including but not limited to preferred materials and ranges and values of amounts, and other unobvious variables material to successfully practicing (including making and using) the invention in the best way contemplated at the time of executing this patent application. In preparing films by casting on a liquid substrate, the casting solution is preferably initially filtered through a filter having pores of about 25 microns or less in diameter.

It is understood that the foregoing detailed description is given merely by way of illustration and that many modifications may be made therein without departing from the spirit or scope of the present invention.

What is claimed is:

1. A film-grid composite substrate for supporting specimens in electron microscopy comprising
   (a) a specimen-support grid adapted for electron microscopy, and
   (b) an ultrathin film comprising a mixture of at least one organopolysiloxane-polycarbonate interpolymer and at least one polyphenylene oxide, regions of a major surface of said film being in contiguous surface-to-surface contact with a major surface of the grid.

2. The composite substrate of claim 1 wherein said contact is adhering contact.

3. The composite substrate of claim 1 wherein said interpolymer comprises dimethylsiloxane and bisphenol-A carbonate polymerized monomer units.

4. The composite substrate of claim 3 wherein said interpolymer is an alternating block interpolymer including from about 50 to about 60% by weight dimethylsiloxane units and containing from about 20 to about 30 dimethylsiloxane units per dimethylsiloxane block.

5. The composite substrate of claim 1 wherein the polyphenylene oxide is poly(2,6-dimethylphenylene oxide).

6. The composite substrate of claim 1 wherein said mixture includes the polyphenylene oxide in an amount from about 20 to about 80 parts by weight and said interpolymer in an amount from about 80 to about 20 parts by weight per 100 parts by the total weight of said polymers.

7. The composite substrate of claim 6 wherein said polyphenylene oxide and said interpolymer are each present in an amount of from about 40 to about 60 parts by weight.

8. The composite substrate of claim 7 wherein each of said polymers is present in an amount of about 50 parts by weight.

9. The composite substrate of claim 1 wherein said grid has apertures of up to about 0.5 micron in diameter, said film overlying said apertures.

10. The composite substrate of claim 1 wherein the grid has a rim portion surrounding a network of crossmembers, said network defining a plurality of apertures.

11. The composite substrate of claim 1 wherein said film is from about 100 to about 1,000 angstroms in thickness.

12. A strip of film-grid composite substrates, comprising
   (a) a releasable support layer,
   (b) a plurality of spaced apart specimen-support grids adapted for electron microscopy and disposed with first major surfaces thereof in releasable surface-to-surface contact with a first major surface of said support layer, and (c) an ultrathin film of a mixture of organopolysiloxane-polycarbonate interpolymer and polyphenylene oxide, said film being in adhering surface-to-surface contact with second major surfaces of said grids and in releasable surface-to-surface contact with regions of said support layer surrounding the grid-contacting regions thereof.

13. The composite substrate of claim 9 wherein said apertures are up to 0.25 mm$^2$ in area.

* * * * *